United States Patent [19]

Cheng

[11] Patent Number: 5,691,648

[45] Date of Patent: *Nov. 25, 1997

[54] METHOD AND APPARATUS FOR MEASURING SHEET RESISTANCE AND THICKNESS OF THIN FILMS AND SUBSTRATES

[76] Inventor: David Cheng, 711 Hibernia Ct., Sunnyvale, Calif. 94087

[*] Notice: The term of this patent shall not extend beyond the expiration date of Pat. No. 5,495,178.

[21] Appl. No.: 558,434

[22] Filed: Nov. 16, 1995

Related U.S. Application Data

[63] Continuation-in-part of Ser. No. 974,853, Nov. 10, 1992, Pat. No. 5,495,178.

[51] Int. Cl.$^6$ ................................................ G01R 31/02
[52] U.S. Cl. .................... 324/716; 324/715; 324/719; 324/718; 437/8
[58] Field of Search ........................ 324/718, 719, 324/709, 715, 716; 437/8

[56] References Cited

U.S. PATENT DOCUMENTS

| | | |
|---|---|---|
| 2,659,861 | 11/1953 | Branson . |
| 2,659,862 | 11/1953 | Branson . |
| 3,601,693 | 8/1971 | Lorentzen . |
| 3,676,775 | 7/1972 | Dupnock et al. . |
| 3,735,254 | 5/1973 | Severin . |
| 4,048,558 | 9/1977 | Goodman . |
| 4,267,506 | 5/1981 | Shiell . |
| 4,335,350 | 6/1982 | Chen . |
| 4,446,424 | 5/1984 | Chatanier .............................. 324/709 |
| 4,546,318 | 10/1985 | Bowden . |
| 4,667,149 | 5/1987 | Cohen et al. . |
| 4,703,252 | 10/1987 | Perloff et al. . |
| 4,706,015 | 11/1987 | Chen . |
| 4,755,746 | 7/1988 | Mallory et al. . |
| 4,758,777 | 7/1988 | Bossard . |
| 4,907,931 | 3/1990 | Mallory et al. . |
| 4,989,154 | 1/1991 | Yamashita et al. . |
| 5,006,809 | 4/1991 | Mang et al. . |
| 5,144,253 | 9/1992 | Blanchard . |
| 5,377,071 | 12/1994 | Moslehi .............................. 324/715 |
| 5,386,188 | 1/1995 | Minneman .......................... 324/715 |
| 5,461,358 | 10/1995 | Ravas ................................. 324/715 |

FOREIGN PATENT DOCUMENTS 2027212  2/1980  United Kingdom .

*Primary Examiner*—Ernest F. Karlsen
*Assistant Examiner*—Jose M. Solis
*Attorney, Agent, or Firm*—Hickman Beyer & Weaver

[57] ABSTRACT

A method and apparatus for measuring sheet resistance and thickness of thin films and substrates. A four-point probe assembly engages the surface of a film on a substrate, and the thickness of the substrate is determined from the point of contact between the probes and film. A measuring apparatus then outputs a voltage waveform which applies a voltage to probes of the probe assembly. An inverter inverts the voltage and provides the inverted voltage on another probe of the probe assembly, thus inducing a current in these probes of the four point probe and through the surface of the film. Two other probes measure a voltage in the film created by the current. The voltages on the current probes provide a voltage close to zero at the other probes, thus allowing these other probes to measure voltages with greater precision. The current created by the voltage waveform and the voltage created across the inner probes are measured for each voltage level of the waveform. A sheet resistance of the film is determined by calculating the slope of a least square fit line of the measured current and voltage. The sheet resistance is proportional to the slope of the least square line. The thickness of the film is calculated by dividing the film resistivity by the calculated sheet resistance.

36 Claims, 9 Drawing Sheets

METHOD AND APPARATUS FOR MEASURING SHEET RESISTANCE AND THICKNESS OF THIN FILMS AND SUBSTRATES

CROSS REFERENCE TO RELATED APPLICATIONS

This application is a continuation-in-part of parent patent application Ser. No. 07/974,853, now U.S. Pat. No. 5,495,178 originally filed Nov. 10, 1992, on behalf of David Cheng, entitled, "METHOD AND APPARATUS FOR MEASURING FILM THICKNESS," assigned to the assignee of this present application, and which is incorporated by reference herein.

BACKGROUND OF THE INVENTION

1. Field of the Invention

This invention relates to the measurement of sheet resistance and thicknesses of samples, and more particularly to the measurement of sheet resistance and thickness of conductive films and substrates.

2. Background of the Related Art

The testing of samples is performed widely in the manufacture of products. For example, the manufacture of integrated circuits (I.C.'s) begins with blank, unpatterned semiconductor wafers. These wafers undergo a number of sometimes critical testing steps before being processed and formed into the final I.C. form. Typically, sheet resistance and wafer (substrate) thickness are tested in the manufacturing process so that the bulk resistivity of a wafer can be determined.

In addition, films of various materials may be applied to substrates and other samples. For example, conductive films are often applied to semiconductor wafers as part of a process for manufacturing integrated circuit chips. Many integrated circuits have devices with submicron geometries, requiring very uniform film thicknesses. It is therefore desirable to have a means for measuring the thickness of the conductive film to ensure uniform film deposition.

Testing of sheet resistance is often done using a test probe assembly that contacts a film 14 formed on a wafer 15, as shown in FIG. 1. The probe assembly 10 usually includes four linearly arranged probes 12a–d, where the two outer probes 12a and 12d direct a constant current I through the film 14 and the two inner probes 12b and 12c read the voltage drop created across the film by the current I on a meter 16. Alternatively, probes 12a and 12c can direct the current I and probes 12b and 12d can read the voltage drop. The constant current I is generated by a current source 18. Following the voltage measurement, the sheet resistance $R_S$ can be calculated from the relationship:

$$R_s = 4.532 \frac{V}{I}$$

where V is the voltage measured by the two inner probes and I is the current flowing through the film. This formula assumes that all four probes of the probe assembly 10 are equally spaced apart. The thickness of a conductive film on the substrate can be calculated from the relationship:

$$\text{Film Thickness(cm)} = \frac{\rho}{R_s}$$

where $\rho$ is the (known) resistivity of the film in ohm-cm, and $R_S$ is the measured sheet resistance.

Four point probe measurement systems have been improved over the basic apparatus described above. In U.S. Pat. No. 3,676,775 by A. Dupnock, a method for measuring the resistivity of an epitaxial semiconductor layer is described in which at least two spaced high conductivity diffused regions are formed in the base wafer prior to deposition of the epitaxial layer, and the four point probe is is located directly over the high conductivity regions. In U.S. Pat. No. 4,989,154 by Yamashita et at., a method and apparatus for measuring resistivity using a four-point probe is described in which a correction coefficient is calculated from shape and position information of the wafer and multiplied by the measured resistance value. The Yamashita et al. apparatus includes a computer controller that receives the four point probe measurements through an analog-to-digital (A/D) converter. In U.S. Pat. No. 4,335,350 by J. Chen, an apparatus utilizing two probes is described, in which a four point probe is engaged with one surface of a wafer, and another probe is engaged with the other surface in order to measure leakage current from the first probe. Finally, in U.S. Pat. No. 4,703,252 by Perloff et al., an apparatus and method for testing the sheet resistance of a wafer is described in which multiple test readings are taken by a four point probe at predetermined test locations on the wafer.

While the prior art four point probe apparatus have been successful in measuring the sheet resistance and film thickness of wafers, they tend to exhibit some undesirable characteristics. For example, the prior art uses constant current sources to provide the current through the film. Current sources are expensive and slow to stabilize, often requiring five seconds or so to stabilize for each measurement. This stabilization delay is undesirable for production environments, where fast measurements are desired.

A further problem with the prior art four-point probe apparatus is the presence of offsets and drifts in the current level of the current source. Inaccurate sheet resistance and film thickness values can result from this problem.

A different problem in the prior art is the presence of hysteresis and magnetic effects that occur when different current levels are tested in the wafer. These effects appear when a large jump in current level occurs and can substantially alter a measurement enough so that its accuracy cannot be relied upon.

Yet another problem occurring in the prior art is measuring voltages to a great degree of precision. This is due to prior art four point probes providing a large voltage magnitude at the inner probes which measure the voltage in the film. The larger the magnitude of voltage, the more difficult it is to measure small fractions of the voltage or small changes in voltage.

Another problem occuring in the prior art pertains to the methods of calculating thicknesses of a wafer or other substrate. Prior art methods usually measure the thickness of a wafer or substrate with a micrometer or other instrument in a separate step from the measurement of other characteristics of the substrate. This can lead to inaccuracies in the calculations of bulk resistivity.

What is needed is an apparatus and method that will quickly test samples for sheet resistance, film thickness, and substrate thickness, allow many measurements of a sample's surface to be taken, and allow more samples to be tested in a given amount of time. What is further needed is an apparatus and method that will eliminate the hysteresis and magnetic effects of taking a measurement with a probe and decrease the voltage magnitude of the measured voltage so as to increase the accuracy and precision of the measurements.

SUMMARY OF INVENTION

The present invention addresses the problems in the prior art by providing a method and apparatus to measure sheet resistance, film thickness, and substrate thickness by coupling a variable voltage source to the outer probes of a probe assembly to provide a variable current through the film. Also, an inverted voltage of the voltage on one outer probe of the probe assembly is applied to the other outer probe to provide a voltage near zero for the inner probes. Probe measurements are taken at many different voltage levels to provide a more accurate overall sheet resistance measurement. These improvements allow film characteristics to be measured in a shorter amount of time and with more accuracy.

A method for measuring the thickness of a substrate includes calibrating the position of the probes of a probe assembly in space relative to the surface of a chuck. A conductive substrate or a substrate with a conductive film is then placed on the chuck and the probes are moved relative to the chuck until the probes are brought in contact with the surface of the film or substrate. By measuring when current flows between probes of the probe assembly, a precise measurement of the thickness of the substrate can be determined.

The apparatus for measuring sheet resistance of a sample comprises a variable voltage source coupled to a first probe of the four point probe assembly by a sense resistor. The probes of the probe assembly engage the surface of a conductive film on a substrate so that a current flows through the surface of the film between the two outer probes. The voltage source preferably includes a digital computer connected to a digital-to-analog converter (DAC) which produces a sawtooth voltage waveform. This sawtooth waveform is then amplified prior to being applied to an outer probe of the four point probe assembly. In a preferred embodiment, a dependent variable voltage is applied to a second outer probe of the probe assembly to create a variable current through a portion of the film. The dependent voltage has about the same magnitude as the voltage applied to the first outer probe and is inverted. The opposite voltages on the outer probes causes opposite voltages on the surface of the film, which in turn causes the film to have a voltage substantially close to zero near the inner measuring probes. Small magnitudes and changes in the voltage waveform can thus be measured more accurately by the inner probes.

The current flowing through the film is measured by sensing the voltage across the sense resistor and applying Ohm's Law (I=V/R). Both the voltage across the sense resistor and the voltage between the inner probes of the four point probe are measured using variable gain differential amplifiers. The differential amplifiers send their respective outputs to analog-to-digital converters (ADCs), which provide digital signals to the digital computer. The computer can then calculate the sheet resistance in the surface of the film from the ratio of the measured current to the voltage measured across the inner probes. In the preferred embodiment, a least squares line fit of a number of input voltage levels in the sawtooth-shaped waveform and corresponding film voltage measurements is made and a sheet resistance is calculated. A film thickness is calculated from the sheet resistance using the known resistivity of the film material. Preferably, the ranges of the DAC and ADCs and the method of calculating a least squares line fit of multiple measurement points can be used to calculate a Figure of Merit which indicates the quality of measurements performed by the system.

The present invention has the advantage of determining substrate thickness by an accurate, simple in-situ method used during the measurement of other characteristics of the substrate and film.

In addition, the present invention has the advantage of measuring I and V rather than assuming I for the sheet resistance measurements.

The present invention also has the advantage of measuring the sheet resistance of the film using a least square fit of the voltage measurements and calculating the slope of the least square line. The sheet resistance is proportional to the slope of this line. Since a slope is measured, the resistance measurement is not sensitive to drifts and offsets in the voltage source or in the entire electronic system.

The present invention also has the advantage of taking many measurements at different current levels in a small amount of time. With many measurements, the accuracy of the resistance measurement is greatly increased. In addition, the zero voltage magnitude on the film near the inner probes of the probe assembly allows small voltage magnitudes and small changes in voltage to be measured much more accurately. Also, since the voltage source generates a voltage waveform instead of a constant current, the invention does not have a delay time that is required for a current source to stabilize. As a result, many more measurements can be taken in a given amount of time, which speeds up the entire process and allows more substrates to be tested. Finally, the measurements are taken with a sawtooth-shaped input voltage waveform, which is continuous and has no large current jumps; this waveform shape tends to eliminate magnetic effects of the film and thus degausses the measurement.

These and other advantages of the present invention will become apparent to those skilled in the art after reading the following descriptions and studying the various figures of the drawings.

DETAILED DESCRIPTION OF THE PREFERRED EMBODIMENTS

Figure 1:
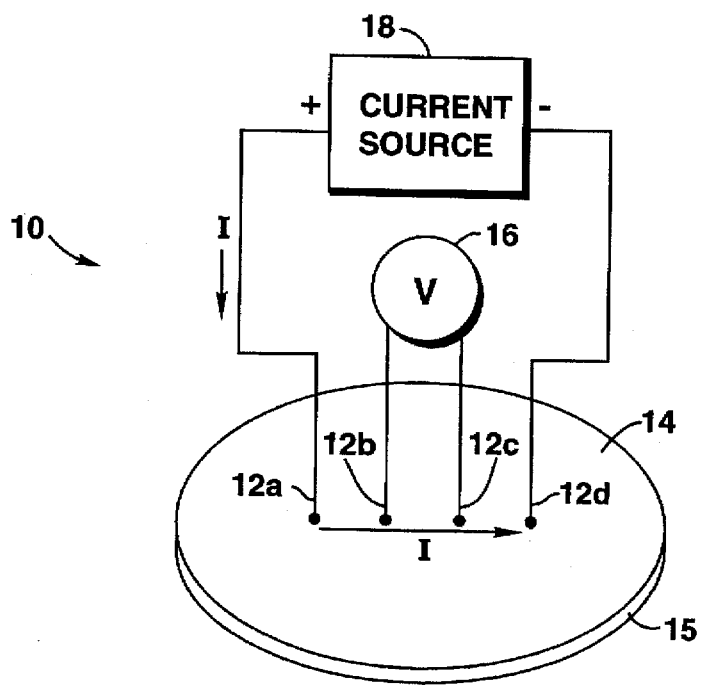
FIG. 1 is a schematic view of a prior art four point probe.
Figure 2:
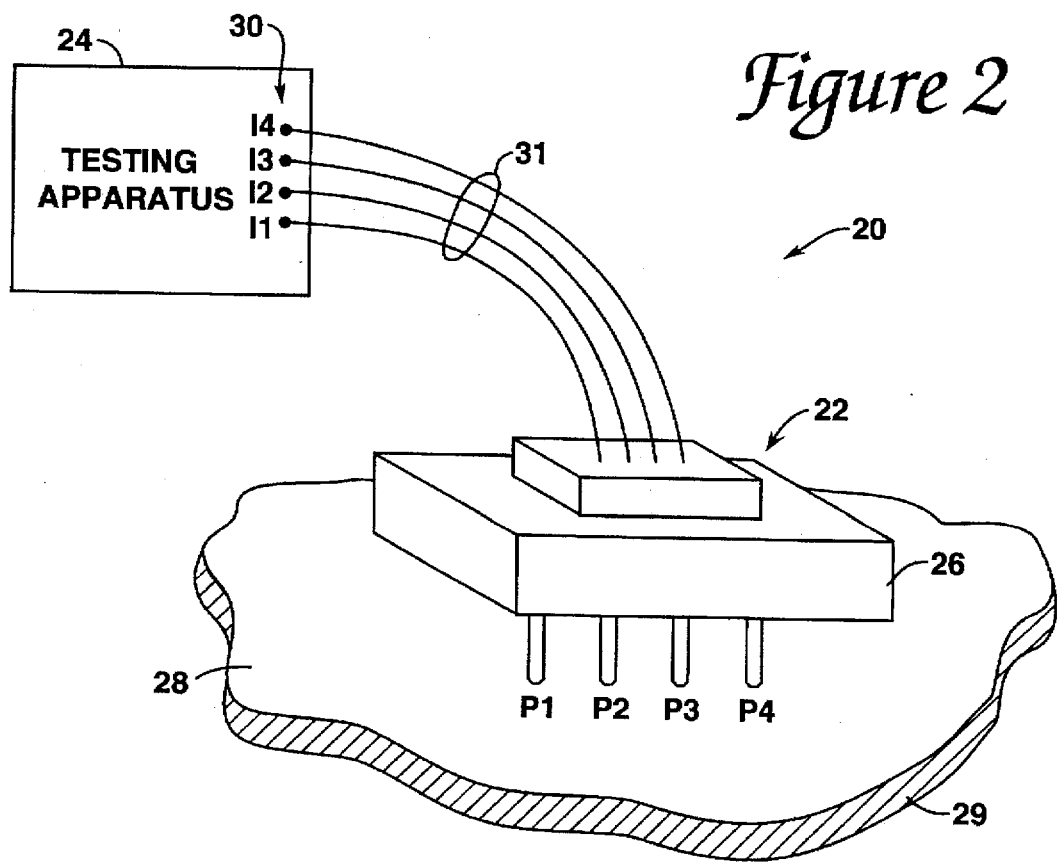
FIG. 2 is a perspective view of a four point probe connected to a measurement apparatus.

A prior art four point probe measurement system was shown in FIG. 1. In FIG. 2, an apparatus for measuring sheet resistance and film thickness 20 is shown for the present invention. Apparatus 20 comprises a test probe assembly 22 and a testing apparatus 24. The assembly 22 comprises test probes P1, P2, P3 and P4 that extend from a housing 26, i.e., there are four test probes in the preferred embodiment, aligned in the standard four-point probe configuration. The test probes P1–4 are preferably spring biased to prevent damage to the film and substrate.

The test probes P1–4 engage the surface of a sample 27. A "sample", as referred to herein, can include a silicon or other semiconductor wafer or other substrate 29, and may include a conductive film 28 deposited on the surface of the substrate. Film 28 is most typically a metal film such as aluminum (Al), tungsten (W), or a metal alloy such as titanium nitride (TiN), titanium tungsten (TiW), tungsten silicide (WSi), or doped silicon. In other embodiments, there may be no conductive film 28, and the sample is a conductive wafer 29 or the like. In such embodiments, the sheet resistance of the entire substrate is determined by the apparatus of FIGS. 3, 3a, and 3b, not the sheet resistance of the film. The embodiments herein are described as though a film 28 is present on a substrate and the sheet resistance of the film is to be determined.

The springs connecting probes P1–4 to the housing allow the probes to shift vertically and thus prevent the probes from marking or damaging the film 28 when they contact the film and provide a good contact between each of the probes and the film surface. Each probe P1–4 is connected to a terminal I1, I2, I3, or I4 (I1–4) of the probe assembly connections 30, located on the testing apparatus 24 (described below). Probe P1 is connected to terminal I1, probe P2 is connected to terminal I2, probe P3 is connected to terminal I3, and probe P4 is connected to terminal I4. The connection is made through insulated wires 31. Current flows preferably from probe P1, through film surface 28, and into probe P4 as described above with respect to FIG. 1.

When the probe assembly engages the surface of film 28, the thickness of the substrate (i.e., the thickness of substrate plus film, or just substrate if no film is present) can be determined in addition to the sheet resistance and thickness of the film. This method of determining substrate thickness is described below with reference to FIGS. 8a and 8b.

Figure 3:
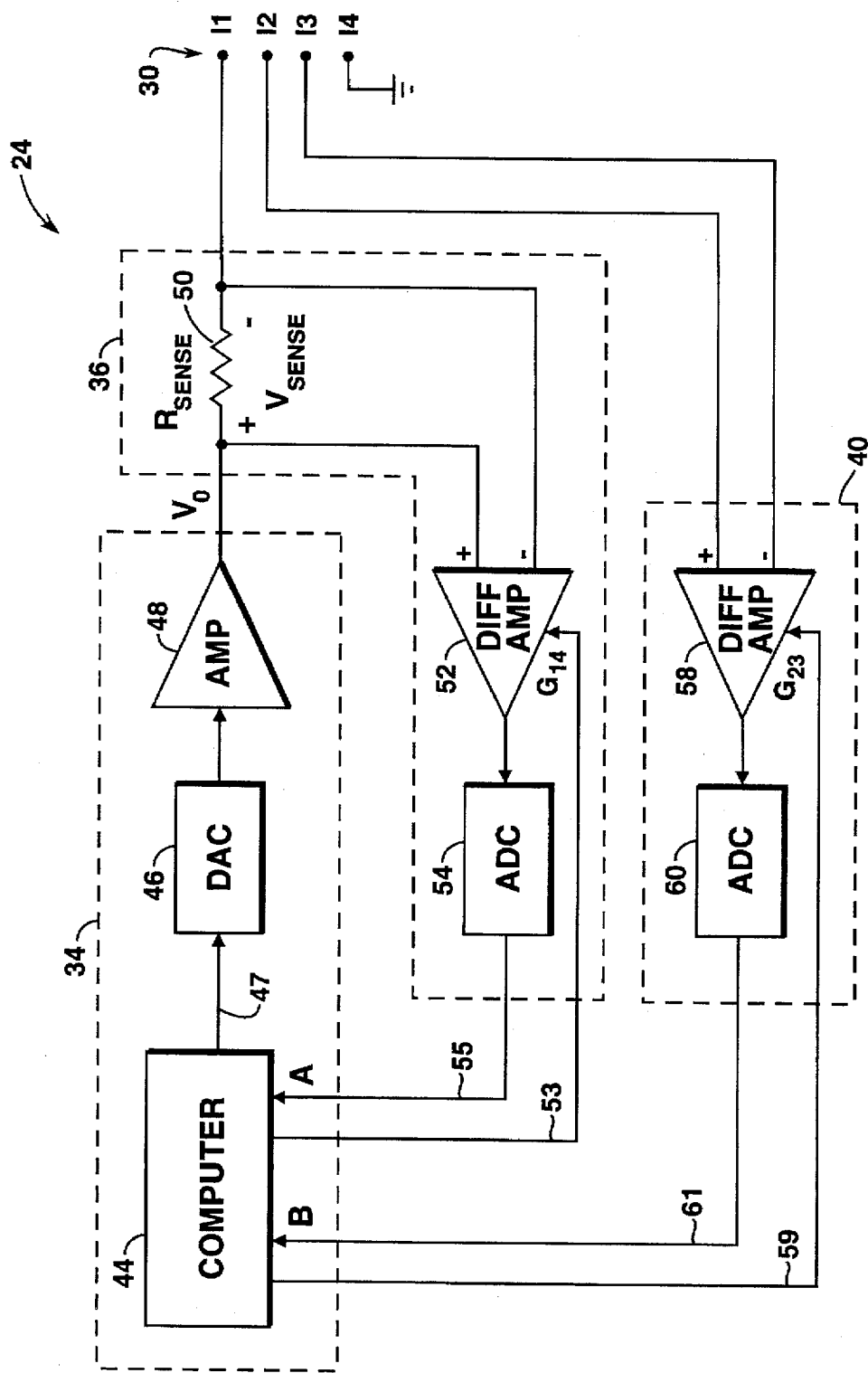
FIG. 3 is schematic diagram of a testing apparatus of the present invention.

FIG. 3 is a schematic diagram of a testing apparatus 24 for measuring the sheet resistance and thickness of a film. The preferred embodiment of the testing apparatus 24 comprises a voltage source 34, probe assembly connections 30, a current sensing means 36, and a voltage sensing means 40.

The voltage source 24 includes a digital computer 44, a digital to analog converter (DAC) 46, and an amplifier 48. The digital computer 44 is a programmable device including a microprocessor and an output interface. A suitable digital computer is an AT class IBM compatible personal computer. The computer is coupled to a DAC 46 by a parallel bus 47. In the preferred embodiment, the bus comprises twelve parallel lines, so that the range of binary numbers received by the DAC is 0 to $2^{12}-1=4095$; a 16-bit or higher resolution DAC can also be used. The computer is programmed to send signals to the DAC that are within the range of −5 to +5 volts. The DAC 46 is thus able to output 4096 different voltage levels ranging from −5 volts to +5 volts. A suitable DAC 46 is made by Analog Devices and has a part number AD7237.

The input of amplifier 48 is coupled to the output of DAC 46. Amplifier 48 preferably has a high gain and thus a high output current. A high current is needed to flow through the film 28 so that the voltage across the inner probes P2 and P3 is large enough to be measured accurately. The amplifier 48 in the preferred embodiment outputs a voltage that ranges from about −35 to +35 volts. This voltage is the output voltage $V_o$ of the voltage source 34. A suitable amplifier 48 is made by Burr Brown and has a part number OPA541.

The probe assembly connections 30 comprise terminals I1–I4. The terminals are electrically connected to the probes P1–P4, respectively, of the probe assembly 22, as described above with reference to FIG. 2, and terminal I1 is also coupled to the output of the voltage source 34 by a sense resistor as explained below. The current produced by source 34 flows through the sense resistor, through probe P1, through the film 28, through probe P4, and to ground at terminal I4. Terminals I2 and I3 are connected to probes P2 and P3, respectively, to measure a voltage across the film. In an alternative arrangement, the current flows through the sense resistor, through probe P1, through the film 28, through probe P3, and to a ground connection at terminal I3. In this alternative arrangement, the voltage is sensed by probes P2 and P4, connected to terminals I2 and I4, respectively, and the voltage sensing means 40 (described below) is connected to terminals I2 and I4 instead of terminals I2 and I3.

Voltage source 34 is coupled to terminal I1 by a current sensing means 36, which includes a sense resistor 50, a differential amplifier 52, and an analog-to-digital converter (ADC) 54. Sense resistor 50 is coupled between the output of the voltage source 34 and the terminal I1, as explained above. The value for the sense resistor 50 can vary between 10 to 10 megaohms; the value is adjusted in a calibration process to optimize the sensitivity of the measurements and varies for different films with different resistivities, as described below with reference to FIG. 5. The sense resistance and gain of the differential amplifier 52 (see below) allow measurements to have a dynamic range of $10^{12}$ to 1. For example, sense resistor 50 can provide a drop so that a voltage of −15 V to +15 V exists at the terminal I1.

Differential amplifier 52 measures the the magnitude of voltage $V_{sense}$ across the sense resistor 50. The differential amplifier in the preferred embodiment is an Analog Devices AD524 or equivalent amplifier. The two input terminals of the differential amplifier are each coupled to one terminal of the sense resistor. Differential amplifier 52 measures $V_{sense}$ across the sense resistor 50 and outputs a voltage adjusted according to the variable gain $G_{14}$ of the differential amplifier 52. The gain $G_{14}$ can be set to different levels by the computer 44 by sending a control signal on control line 53 to set gain tabs on the differential amplifier 52. In the preferred embodiment, gain $G_{14}$ can be set at 1, 10, 100 or 1000. The gain is set to maximize the range of the ADC 54.

The output of the differential amplifier 52 is coupled to an analog-to-digital converter (ADC) 54. The ADC in the preferred embodiment is an Analog Devices AD574. The ADC 54 inputs a range of voltages and has a resolution of twelve bits; a higher resolution ADC can also be used. A range of binary signals from 0 to 4096 can be sent on the twelve bit bus 55 coupled to the output of the ADC. The bus 55 is coupled to an input port of a digital computer; the digital computer 44 of the voltage source 34 is preferably used. The computer receives data over the bus 55, which is the signal A representing the sense voltage $V_{sense}$ across the sense resistor 50. The computer calculates the magnitude of the current $I_{sense}$ through the sense resistor by dividing the sense voltage $V_{sense}$ by the known sense resistance value $R_{sense}$. $I_{sense}$ is equal to the current flowing through the outer probes and the film.

Voltage sensing means 40 comprises a differential amplifier 58 and an ADC 60. The differential amplifier 58 in the preferred embodiment is an Analog Devices AD524 or equivalent amplifier. The differential amplifier 58 has two input leads which are coupled to the terminals I2 and I3, respectively, of the probe assembly connections 30. Terminals I2 and I3 are coupled to inner probes P2 and P3, respectively, of the probe assembly 22. Differential amplifier 58 senses the the magnitude of voltage $V_{23}$ (i.e., "film voltage" or "sample voltage") across terminals I2 and I3, which is the voltage induced in the film between the points where the inner probes contact the film. This voltage is induced by the current provided by the voltage source Vo.

Differential amplifier 58 outputs a voltage adjusted according to the variable gain $G_{23}$ of the differential amplifier 58. The gain $G_{23}$ can be set to different levels by the computer 44 by sending a control signal on control line 59 to set gain tabs on the differential amplifier 58. In the preferred embodiment, gain $G_{23}$ can be set at 1, 10, 100, or 1000. The gain should be set to maximize the range of the ADC 60.

The output of the differential amplifier 48 is coupled to an ADC 60. Similar to the ADC 54 of the current sensing means 36, the ADC 60 has, for example, a resolution of twelve bits, so that a digital binary output from 0 to 4095 can be sent on a twelve bit bus 61 coupled to the output of the ADC 60. The bus 61 is coupled to an input port of the digital computer 44. The computer receives the data from the ADC over bus 61; the data is the digital signal B representing the voltage across probes P2 and P3 on the film surface 28. In an alternate embodiment, ADC 54 and ADC 60 can be combined as a single ADC which receives the inputs from differential amplifier 48 and differential amplifier 58 to provide digitial signals to computer 44.

Preferably DAC 46, amplifier 48, differential amplifiers 58 and 52, and ADC's 54 and 60 are provided on a plug-in board for computer 44. Alternatively, the DAC 46 and the ADC 60 are provided on a plug-in board for computer 44 and the amplifiers are externally provided near the probe assembly 22.

Figure 3A:
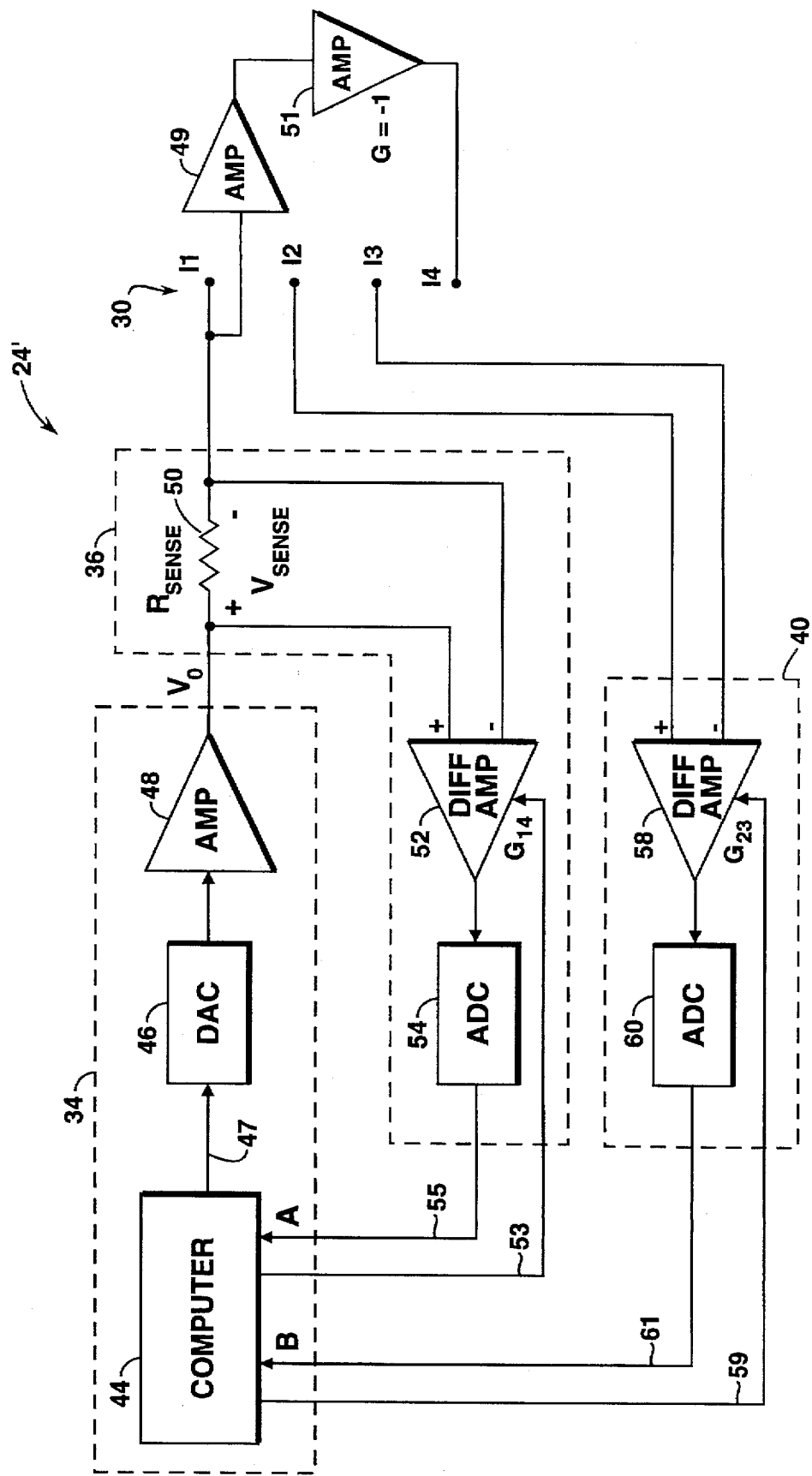
FIG. 3a is a schematic diagram of a first alternate embodiment of the testing apparatus of FIG. 3.

FIG. 3a is a schematic diagram showing an alternate embodiment 24' of the testing apparatus 24 shown in FIG. 3. Like testing apparatus 24, apparatus 24' includes a voltage source 34, probe assembly connections 30, current sensing means 36, and voltage sensing means 40.

Testing apparatus 24' additionally includes a buffer amplifier 49 and an amplifier 51. Buffer amplifier 49 has an input coupled to terminal I1. Buffer amplifier 49 preferably has a unity gain and includes a high input impedance so that only a small amount of current is diverted from flowing through terminal I1 and the surface of film 28.

Inverting power amplifier 51 is similar to amplifier 48 and has an input coupled to an ouput of buffer amplifier 49. Power amplifier 51 has a gain of about −1 to invert the voltage read at terminal I1. The output of power amplifier 51 is connected to terminal I4. Thus, a voltage $V_4$ at terminal I4 (and probe P4) is the inverted form (i.e., 180 degrees out of phase) of the voltage $V_1$ at terminal I1 (and probe P1), i.e., voltage $V_4$ is a "dependent voltage" that is based on the value of voltage $V_1$. Other devices or components can also be used to provide a voltage $-V_1$ on terminal I4 so that the voltages at the outer probes of the probe assembly add to zero.

The effect of having a voltage V1 at terminal I1 and a voltage $-V_1$ at terminal I4 is to provide a zero voltage on the surface 28 of the wafer 29 at about the middle point on the film between probes P1 and P4. In the previous embodiment of FIG. 3, probe P1 had a voltage of $V_1$ and probe P4 had a voltage of 0 (ground). The middle point between probes P1 and P4 had an average voltage of ½ $V_1$, since resistance of the film is approximately evenly distributed between probe P1 and probe P4. Thus, the inner probes P2 and P3 have a voltage near ½ $V_1$. For example, in the embodiment of FIG. 3, if $V_1$ is 1 volt, $V_2$ is about 0.67 volts and $V_3$ is about 0.33 volts. In the embodiment of FIG. 3a, however, the average voltage at the middle point between probes P1 and P4 is about 0, since $(V_1+V_4)/2=(V_1-(-V_1))/2=0$. Thus, the average of $V_2$ and $V_3$ at probes P2 and P3, $(V2-V3)/2$, is close to zero.

The effect of having a very small magnitude of voltage at probes P2 and P3 is to increase the ability to measure voltages to a very accurate level. If a zero (ground) voltage is provided at terminal I4, as in the embodiment of FIG. 3, then a large voltage magnitude is produced at probes P2 and P3 and small changes in voltage are difficult to read. For example, if $V_1$ is previously set to 1 V, and the voltage source then varies $V_1$ to 1.0001 V for a new measurement at $V_{23}$, then the change in voltage (0.0001 V) is minor compared to the magnitude of the voltage that is read at both $V_2$ and $V_3$. The small change in voltage of 0.0001 V is more difficult to read accurately since $V_2$ and $V_3$ are close to about 0.5 volts, which is much higher than the change. If, however, the voltage $V_2$ and $V_3$ are close to zero, as in the embodiment of FIG. 3a, a small voltage change, such as 0.0001 V, is easier to detect. Thus, in the embodiment of FIG. 3a, the accuracy of measuring $V_2$ and $V_3$ (and thus $V_{23}$) is increased since voltages can be detected with much greater precision.

The feature of providing an inverted voltage at the opposite probe of the probe assembly, as shown in FIG. 3a, can be used in other embodiments as well. For example, in one embodiment, a voltage $V_o$ is not varied and only one measurement is taken, and the inverted voltage can still be provided at probe P4 to increase the accuracy of voltage measured by the inner probes P2 and P3. In addition, in the other embodiment where a voltage is applied to probes P1 and P3 and the voltage is measured between probes P2 and P4, probe P1 can be proved with a voltage $V_1$ and probe P3 can be provided with a voltage $V_3=-V_1$, similarly as described above. Also, the advantage of providing close to zero voltage at the midpoint between probes P1 and P4 can be useful in other four-point probe arrangements, such as the positioning of probes P1–4 in a square (rather than linear) configuration.

Figure 3B:
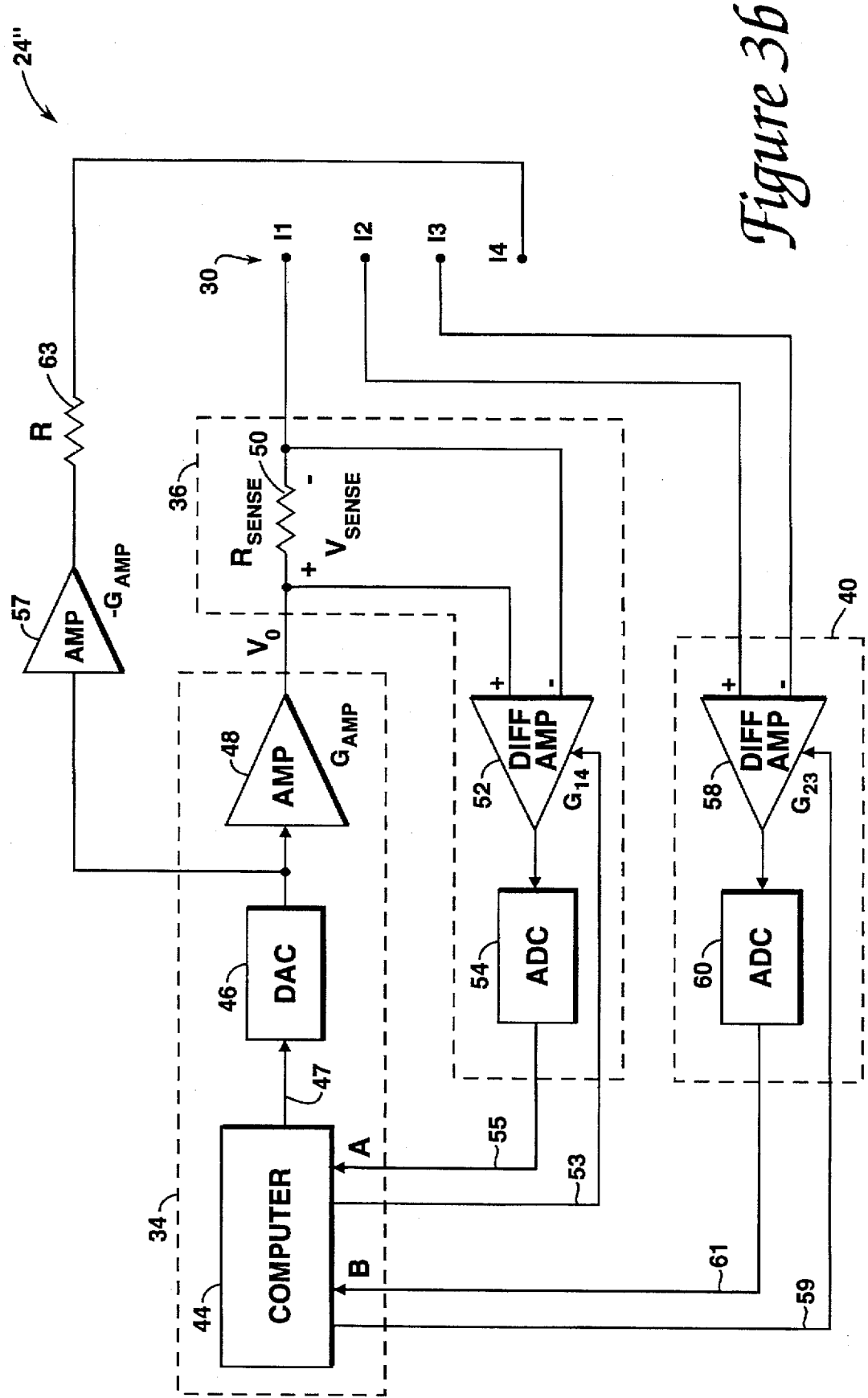
FIG. 3b is a schematic diagram of a second alternate embodiment of the testing apparatus of FIG. 3.

FIG. 3b is a schematic diagram showing a second alternate embodiment 24" of the testing apparatus 24 shown in FIG. 3. Like testing apparatus 24 and 24', apparatus 24" includes a voltage source 34, probe assembly connections 30, current sensing means 36, and voltage sensing means 40.

Testing apparatus 24" additionally includes an inverting amplifier 57 and a second resistor 63. Inverting amplifier 57 has an input coupled to the output of DAC 46. Inverting amplifier 57 preferably has a gain that is $-G_{amp}$, the negative of the gain $G_{amp}$ of amplifier 48. Second resistor 63 is coupled to the output of inverting amplifier 57 and is also coupled to the terminal I4 connected to probe P4. Resistor 63 has preferably the same resistance value as sense resistor 50 coupled between amplifier 48 and terminal I1.

In the embodiment of FIG. 3b, a voltage $V_4$ at terminal I4 (and probe P4) has been amplified the same amount as the voltage $V_1$ applied to terminal I1 (and probe P1) and has been inverted. Thus, $V_4$ on probe P4 is about the same magnitude and opposite phase of voltage $V_1$. In addition, the second resistor 63 in conjunction with inverting amplifier 57 acts as a current source so that a current flows from terminal I4 to I1 which is equal to the current flowing from terminal I1 to I4, i.e., P4 carries an equal and opposite current to probe P1. Other system configurations can also be implemented to provide equal and opposite currents at probes P1 and P4. For example, an inverting buffer amplifier having a gain of −1 can be coupled to the output of amplifier 48, and the second resistor 63 can be coupled between the output of the buffer amplifier and terminal I4. This would produce nearly the same result as the configuration of FIG. 3b.

The effect of having an equal magnitude and opposite phase current at probes P1 and P4 is to provide a zero voltage on the surface of the film more accurately than in the embodiment of FIG. 3a and bring the magnitudes of the voltages at the inner probes closer to zero, thus increasing the accuracy of the voltage measurement at probes $V_2$ and $V_3$. For example, in the embodiment of FIG. 3a, a $-V_1$ voltage from probe P1 was directly applied to probe P4. However, the voltages on the surface of the film may be slightly different from the voltages on the probes due to contact resistance between the probes and the surface. Thus, the voltage on the surface of the film at probe P4 may not quite be the opposite of the voltage on the film surface at probe P1, thus creating some shift in the zero voltage point from the midpoint between the probes and leading to some inaccuracy.

The embodiment of FIG. 3b effectively reduces the role of probe-film contact resistance in influencing surface voltages on the film. Since the sense resistor 50 and the second resistor 63 have a much larger resistance than the contact resistance, the effect of the contact resistance is minimized. The second resistor 63 at probe P4 thus creates an equal and opposite current and voltage on the film surface at the locations of the probes P1 and P4. A zero voltage is therefore created on the film surface at the midpoint between the probes P1 and P4, which allows the voltages at both probes P2 and P3 to be closer to zero. This in turn allows the measurement of small voltages and small changes in voltage at probes P2 and P3 to be more accurate. In other embodiments, other components or configurations can be used to similarly provide equal and opposite voltages on two points of the film surface to create a current therebetween and to measure the voltage in the film.

Figure 4:
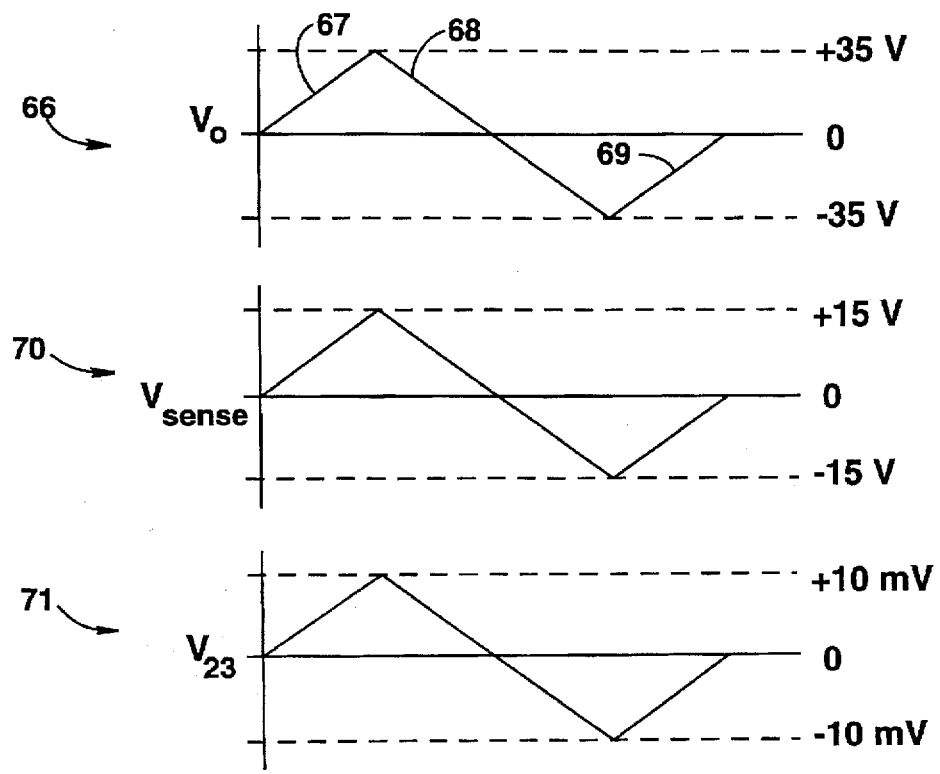
FIG. 4 is graph of the output sawtooth waveform and the corresponding sense voltage and probe voltage waveforms.

FIG. 4 shows graphs of the voltage waveforms used in this preferred embodiment of the present invention. The graph 66 of $V_o$ shows an example of a time-variant sawtooth-shaped waveform generated by the voltage source 34 and varying (at a maximum) from −35 volts to +35 volts. Each cycle of the sawtooth-shaped waveform comprises an upwardly-sloping ramp 67, a downwardly-sloping ramp 68, and another upwardly-sloping ramp 69. The sawtooth-shaped waveform has the advantage of being substantially continuous, thereby avoiding any sudden jumps in current that may cause hysteresis effects in the measurements. The sawtooth-shaped waveform of $V_o$ includes a number of voltage steps, each step corresponding to a number preferably between 0 and 4095 output by the computer 44. The sawtooth-shaped waveform is thus made up of 2048 steps in the upward-sloping ramp 67, 4096 steps in the downward-sloping ramp 68, and 2048 steps in the upwardly-sloping ramp 69. The graph 70 of $V_{sense}$ and the graph 71 of $V_{23}$ (i.e. the voltage across probes P2 and P3) show the same sawtooth-shaped voltage waveform shown in the $V_o$ graph. This relationship shows that the current across the sense resistor and the voltage across the probes P2 and P3 vary substantially in phase with the source voltage, so that for each point in the $V_o$ waveform, a corresponding $V_{sense}$ and $V_{23}$ can be measured. As an example, the voltage $V_{sense}$ in graph 70 can vary between +15 and −15 volts when Vo varies between +35 and −35 volts (limits to the range can depend on $V_o$ and the value of the sense resistor). As a result, the voltage $V_{23}$ may vary, as a typical example, between +10 mV and −10 mV in the embodiment of FIG. 3, as shown in graph 71. Voltage $V_{23}$ may vary about the same, from +10 mV and −10 mV, in the embodiments of FIG. 3a and 3b.

Figure 5:
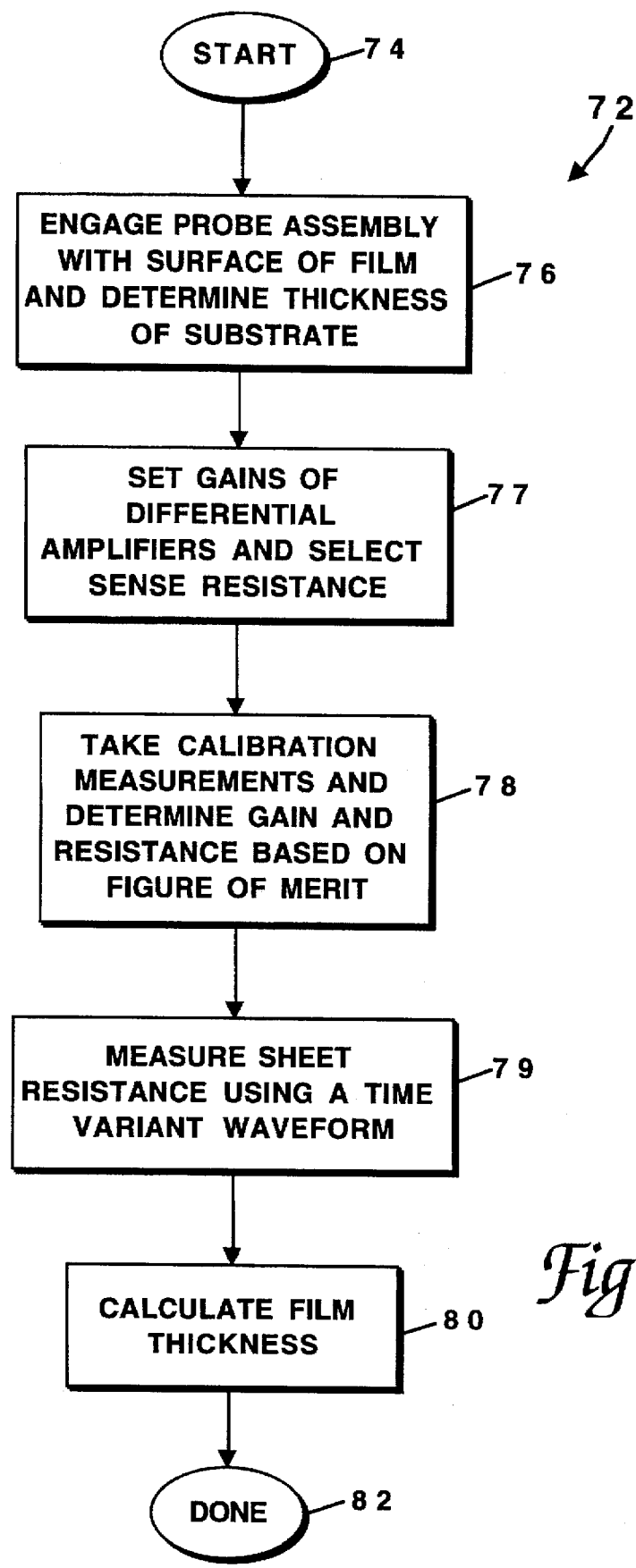
FIG. 5 is a flow diagram of a method to calculate film thickness.

FIG. 5 is a flow diagram of a method 72 of measuring film thickness. Prior to the testing of specific substrates, the position of the probe assembly is preferably calibrated with respect to the position of a chuck or other surface on which the substrate 29 is resting. This calibration is performed so that the thickness of the substrate (including the film, if present) can be determined when the probe assembly engages a film surface in step 76. In this calibration, the probe assembly is preferably brought into contact with a test substrate having a known, accurate thickness. The computer 44 then precisely knows the position of the tips of the probes P1–4 of the probe assembly with respect to the position of the support surface and a thickness measurement of any sample can be made, as described below with reference to FIGS. 8a and 8b.

The method 72 begins at step 74. In a step 76, the probe assembly is engaged with a surface of the film which is to be measured for sheet resistance. The film is made of a conductive material that allows a current to easily flow. The most typical application is the measurement of the thickness of metal films deposited on semiconductor wafers. Alternatively, the probe assembly can be brought in contact with a conductive substrate. The probe assembly 22 is brought into contact with the surface 28 of the film so that all of the probes P1–4 are touching the surface. This can be accomplished by moving either the probe assembly 22 or the substrate 29. The probes P1–4 are preferably spring-loaded so that they relieve pressure on the film surface when initially brought in contact with the surface, and so that they all make good contact with the film. When the probes first make contact with the film surface, the computer 44 can determine the position of the surface of the film and can thereby determine the thickness of the substrate, as detailed below with respect to FIGS. 8a and 8b.

In a step 77, the measuring system is provided with initial calibration settings. The goal of step 77 is to adjust the measured voltages $V_{sense}$ and $V_{23}$ so that they are within the voltage range of the ADCs 54 and 60. Since the resistivity of different samples can vary within 8–10 orders of magnitude, such a step is necessary to be able to accurately measure sheet resistance. The variable gains $G_{14}$ and $G_{23}$ of the differential amplifiers 52 and 58 are set by the computer 44 by control lines 53 and 59, respectively. To correctly set the gains, the computer outputs a constant test voltage $V_o$, which can be approximately 1 or 2 volts in the preferred embodiment, and receives an initial measurement from signals A and B (as shown in FIG. 3) from the four point probe assembly 22 so that the range of the measured voltages $V_{sense}$ and $V_{23}$ is known. The computer 44 sets the gains $G_{14}$ and $G_{23}$ with the control lines 53 and 59 so that the output of the differential amplifiers 52 and 58 is in the range of the ADCs 54 and 60. For example, in the described embodiment, the gains $G_{14}$ and $G_{23}$ can be set to 1, 10, 100, or 1000 for each amplifier 52 and 58 to adjust the sensed voltages. In addition, sense resistor 50 is preferably a variable resistor such that the resistance of resistor 50 can be set to a desired value by control signals (not shown) ouput by computer 44. The resistor 50 can be set to a value that allows the range of ADC's 54 and 60 to be effectively utilized.

For example, one method to set initial settings in step 77 is now described. Gain $G_{14}$ is set to a constant value, such as 1, and sense Resistor 50 is set to its highest resistance value. A constant voltage Vo is output at, for example, ¼ the maximum possible output voltage. The voltage $V_{23}$ is then measured. If this voltage is not above some predetermined threshold, such as ⅛ the maximum output voltage Vo, then the resistance of the sense resistor 50 is changed to a lower setting. If the resistance of sense resistor 50 is lowered to a minimum resistance and voltage $V_{23}$ is still not above the threshold, then the gain $G_{23}$ can be raised until $V_{23}$ is above the threshold.

Figure 7:
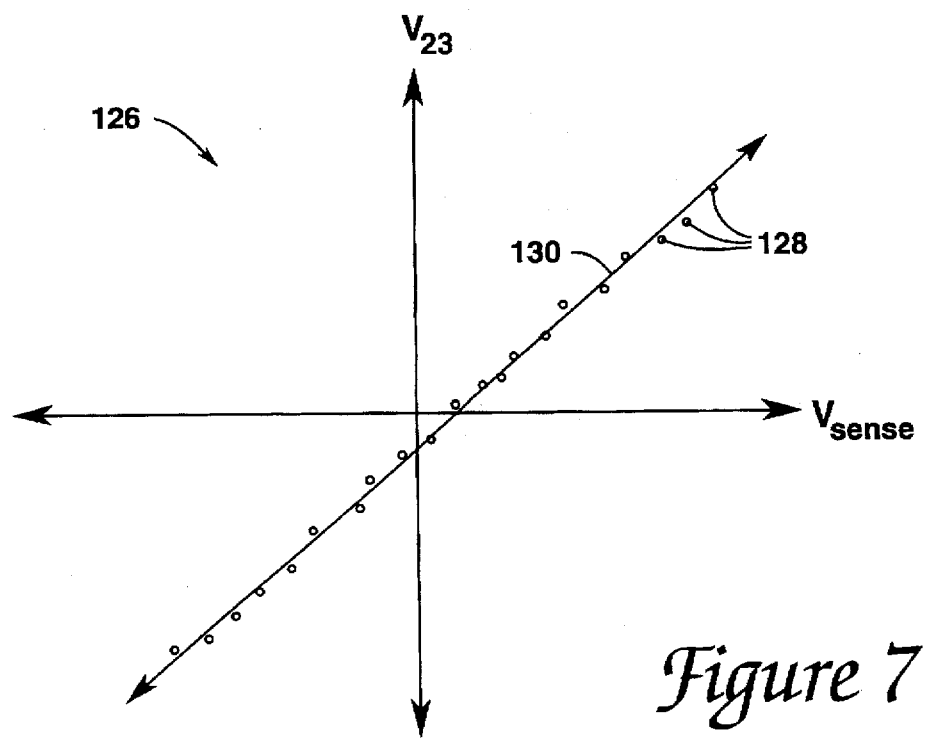
FIG. 7 is a graph of measurements of the sense voltage vs. the voltage across the inner probes of the four-point probe.

In step 78, additional calibration measurements are taken and the values of gains and the sense resistor are optimized based on a "Figure of Merit" to increase the accuracy of measurements. The Figure of Merit is a parameter that indicates the quality (e.g., repeatability) of sheet resistance measurements taken by the system based on multiple voltage datpoints recorded in the present invention. In the preferred embodiment, the Figure of Merit is based on a least square fit line (as shown in FIG. 7), the utilization of the ranges of the ADCs 54 and 60 and DAC 46, and the total number of voltage datapoints taken. This parameter is very useful for determining the quality of the measurements of the system and is ideally suited for the multiple measurements taken with the present invention.

For example, in the described embodiment, a Figure of Merit can be calculated by multiplying the utilized range of ADC 60 for voltage $V_{23}$, the utilized range of ADC 54 for voltage $V_{sense}$, and the utilized range of DAC 46 for voltage $V_o$. The utilized ranges for these components is determined using the outputs of amplifiers 52 and 58 and the input to amplifier 48. For example, in the preferred embodiment, ADC 54 may produce a digital number from 0 to 4095 (12 bits) depending on the analog voltage received from differential amplifier 52, where an received analog voltage of −1 V produces the number 0 and a voltage of 1 V produces the number 4095, i.e., each number corresponds to 1/4096 which equals about a 0.025% resolution for ADC 54. However, if the voltage output from amplifier 52 ranges from +½ V to −½ V, only 2048 of the possible 4095 output numbers of ADC 54 are being utilized, i.e., each number corresponds to 1/2048 which equals about a 0.05% resolution for ADC 54. The utilized range of ADC 54 is thus about 50% of the possible range. If the output voltage of amplifier 52 ranges from +0.1 V to −0.1 V, then only 10% of the range of the ADC is used. Typically, not less than 10% of a range of an ADC will be utilized in the described embodiment, since the gains $G_{14}$ and $G_{23}$ will have been set in step 77 to compensate for any less utilization.

The (normalized) ranges of ADC 54, ADC 60, and DAC 46 are multiplied together for use in calculating the Figure of Merit. The ranges of the ADC's and DAC are determined in this step by outputting a cycle of voltages from voltage source 34 in a calibration voltage cycle, which is similar to the cycle of voltages output as described with reference to FIG. 6, and checking the numbers received by computer 44 from ADC's 54 and 60.

In addition, to calculate the Figure of Merit, the multiplied ranges of the ADC's and DAC's are preferably divided by a least square fit value indicative of the correlation of calibration datapoints to a least square fit line. The calibration datapoints are recorded during the abovementioned calibration test cycle similar to recording datapoints during actual measurements. A least square line is fit to the datapoints, as described in greater detail with respect to FIG. 7. Preferably, the least square fit value is an average of the distances of each calibration datapoint from the fit line, where 0 can equal an exact correspondence of the datapoints to the fit line, and higher numbers indicate more deviation of datapoints from the fit line. Finally, the number resulting from the multiplication of the ranges and the division of the least square fit value is multiplied by the number of datapoints recorded to achieve a numerical result equalling the Figure of Merit. The greater the value of the Figure of Merit, the greater the quality of the measurements taken with the system.

Preferably, after one such Figure of Merit is calculated, a number of additional Figures of Merit are calculated with different gains and resistor settings in the system. The different Figures of Merit are then compared and the component settings resulting in the highest Figure of Merit are chosen as the desired system settings. For example, a Figure of Merit can be calculated for combinations of resistances of sense resistor 50 and gain $G_{23}$ near the settings found in step 77, e.g., if sense resistor 50 was set to 100 ohms and gain $G_{23}$ was set to 100 in step 77, then sense resistor 50 can be changed to 10 ohms and 1000 ohms and gain $G_{23}$ can be changed to 10 and to 1000 such that a Figure of Merit is calculated for each combination of settings, resulting in nine different Figures of Merit. The sense resistor and gain $G_{23}$ are then set to those values that, in combination, produced the best Figure of Merit. Once the optimal settings have been selected from steps 77 and 78, then the actual testing of sheet resistance can commence.

In a step 79, the process of measuring the sheet resistance of the surface of the film is described for a single location or site on the film. A time-variant waveform $V_o$ is sent by the voltage source 34 to the probe assembly 22 to create a current through the film. This current creates a voltage between the inner probes P2 and P3 (and/or the probes P1 and P3 or P2 and P4, as described subsequently). The voltages $V_{sense}$ and $V_{23}$ are measured by the differential amplifiers and a sheet resistance is calculated by a digital computer for the film. The process is described in detail with reference to FIG. 6.

In an (optional) step 80, a digital computer can calculate the film thickness, which is calculated using the formula:

$$\text{Thickness(cm)} = \frac{\rho}{R_s}$$

where ρ, the resistivity of the film in ohm-cm, is a known value for the film material. $R_s$ is the sheet resistance, which is the resistance value calculated in step 78 from the measured voltages $V_{sense}$ and $V_{23}$. There are several methods to compute film thickness. The method in the preferred embodiment is to calculate a film thickness from the $R_s$ value calculated in step 78 from a least squares line fit. Another method is to calculate a film thickness for each measured $R_s$ value stored in step 78 and then average the film thicknesses. A third method is to calculate the film thickness from an average $R_s$ value calculated in step 78. After the film thickness is calculated, the method is completed as indicated in step 82.

Alternatively, the resistivity ρ can be calculated for a substrate in the case when no film is present on a conductive substrate. The thickness of the substrate is known from step 76, so that the bulk resistivity of the wafer (substrate) can be calculated by multiplying the thickness by the found sheet resistance. In addition, other formulas well known to those skilled in the art can be used to calculate other characteristics of a film or substrate.

Preferably, once the sheet resistance, film thickness, and substrate thickness is determined in steps 76, 79, and 80, then the probe assembly can be moved from the surface of the film (or the film can be moved from the probe assembly) and the probe assembly can be brought into contact with the film at a different location on the film. The film and substrate thicknesses and the sheet resistance can then be calculated at the new location. Using such a method, several locations on the film surface can be tested for these characteristics.

Figure 6:
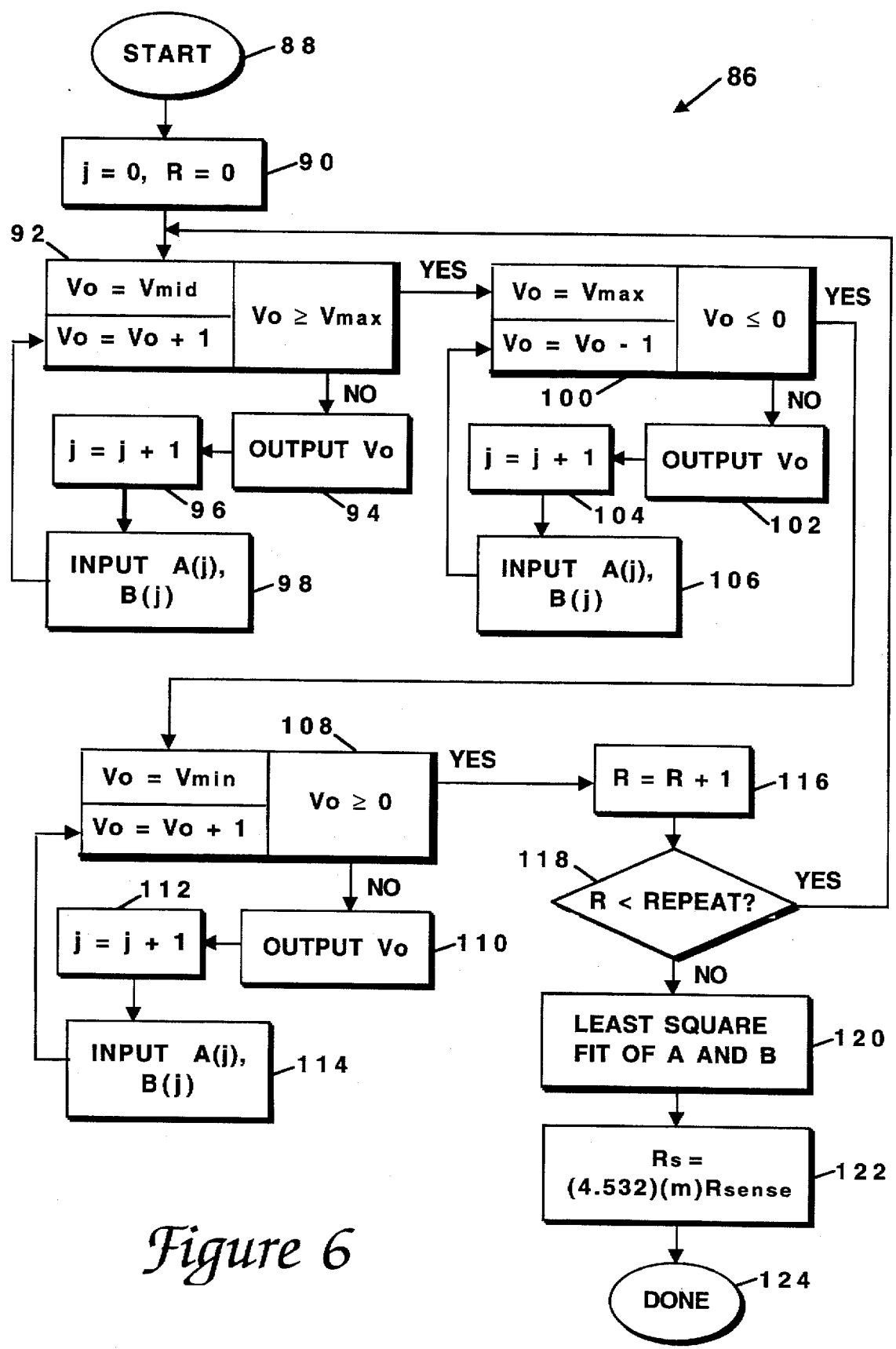
FIG. 6 is a flow diagram of a method to measure sheet resistance using a time variant waveform.

FIG. 6 is a flow diagram of the method 86 of measuring sheet resistance of a film (or substrate), shown in step 78 of FIG. 5. The method starts with step 88 and, in step 90, counter variables j and R are initialized to zero. In a step 92, voltage $V_o$ from the voltage source 34 is set to zero volts, which is equal to the number 2048 on a scale from 0 to 4095 in the preferred embodiment. $V_o$ is compared to the maximum level $V_{max}$ of $V_o$, which is the number 4095. If $V_o$ is greater than or equal to $V_{max}$, then the upward ramp 67 of the sawtooth is complete, and the next step is step 100, described below. If $V_o$ is less than $V_{max}$, then $V_o$ is output on bus 47 by the voltage source 24 in a step 94. Index variable j is incremented in step 96, and input signals A and B are read in and stored as subscripted variables A(j) and B(j) in step 98. Signals A and B represent the voltages $V_{sense}$ and $V_{23}$, respectively, read by the differential amplifiers 52 and 58. Once the values of signals A and B are stored in step 98, then $V_o$ is incremented by the computer in step 92 and compared again to $V_{max}$. Until $V_o$ reaches the maximum voltage, the computer increments $V_o$, outputs $V_o$, and stores the signals A and B measured at that $V_o$ value. Once the voltage $V_o$ is at the maximum level, the first ramp 67 of the sawtooth waveform is complete and step 100 is initiated.

Step 100 begins the downwardly-sloping ramp 68 of the sawtooth waveform as seen in FIG. 4. $V_o$ is set at the maximum voltage $V_{max}$, corresponding to the number 4095 in the preferred embodiment. $V_o$ is compared to zero; if it is less than or equal to zero, the ramping is complete, and the next step is 108 (described below). If $V_o$ is greater than zero, then voltage source 24 outputs $V_o$ on bus 47 in a step 102. Index variable j is incremented in step 104, and input signals A and B are read as subscripted variables A(j) and B(j) in step 106. Signals A and B represent the voltages $V_{sense}$ and $V_{23}$, respectively, read by the differential amplifiers 52 and 58. The values of signals A and B are stored in step 106, and the value of $V_o$ is decremented in step 100. The loop continues in the same manner so that $V_o$ is outputted on bus 47 each time it is decremented and signals A and B are read and stored in the computer for each level of $V_o$. When $V_o$ reaches −5 volts (the number 0), the downwardly-sloping ramp 68 is complete and step 108 is initiated.

Step 108 begins the final upwardly-sloping ramp 69 of the $V_o$ waveform cycle as seen in FIG. 4. $V_o$ is set at the minimum voltage $V_{min}$, corresponding to the number 0 in the preferred embodiment. $V_o$ is compared to $V_{mid}$ (equal to 2048); if it is greater than or equal to $V_{mid}$, the ramping is complete, and step 116 is initiated. If $V_o$ is less than zero, then $V_o$ is output and signals A and B are measured and stored by the computer in a similar fashion as described for steps 92-98 above. When $V_o$ reaches 0 volts (the number 2048), the upwardly-sloping ramp is complete and step 116 is initiated.

The voltage source 34 can vary the voltage $V_o$ very quickly, and thus many voltage measurements A and B are taken in a given time period. Since a voltage is being varied, no delay time for allowing a current level to stabilize in a current source is necessary.

Steps 116 and 118 are optional. In a step 116, variable R is incremented. R stores the count of cycles that the voltage $V_o$ has cycled through. A cycle has occurred each time the voltage $V_o$ is incremented through an upwardly-sloping ramp and decremented through a downwardly-sloping ramp. Each cycle preferably consists of 8192 levels of $V_o$, so that there are 8192 different sets of stored A and B data. Alternatively, every other level of Vo can be ignored so that 4096 sets of data are measured.

In a step 118, the variable R is compared to the REPEAT variable. The REPEAT variable specifies the number of cycles that the user wishes the voltage $V_o$ to cycle through. Thus, in the preferred embodiment, REPEAT multiplied by 8192 equals the total number of different measurements taken on the film surface. If R is less than REPEAT in step 118, another cycle of the $V_o$ waveform is initiated at step 92. If R is greater than REPEAT, step 120 is initiated. In the preferred embodiment, one cycle of the voltage waveform is always used for any film, resulting in 8192 measurements (or 4096 if every other step in the waveform is ignored). In this case, REPEAT is always set to 1, and steps 116 and 118 are not required.

The value of the sheet resistance of the film $R_s$ is calculated next using a least square line fit of the measurement voltage values stored in the previous steps. In step 120, a least square line fit is calculated from the data points of stored values A(j) and B(j) (see FIG. 7). As explained above, there are up to 8192 data points stored in the preferred embodiment. The method for generating a least square line fit with existing data is well-known in the art. $R_s$ is proportional to the slope m of the least square line. The equation describing the least square line is:

$$V_{23} = V_{23}^o + m V_{sense}$$

Ignoring $V_{23}^o$, which contains DC offsets of the entire electronic system, the slope m is equal to:

$$\text{slope} = m = \frac{V_{23}}{V_{sense}}$$

$R_s$ is calculated from the known equation:

$$R_s = 4.532 \frac{V_{23}}{I_{sense}} = 4.532 \frac{V_{23}}{V_{sense}} R_{sense}$$
$$= 4.532 m R_{sense}$$

where $I_{sense}$ is the current flowing through the film, $R_{sense}$ is the known resistance of the sense resistor 50, and $V_{sense}$ is the voltage across the sense resistor. $V_{sense}$ and $V_{23}$ are stored in the computer as values A(j) and B(j), respectively. $R_s$ is calculated using the known formula 4.532(V/I) that assumes the four probes of the probe assembly 22 are spaced equally apart. In step 122, the computer multiplies the factor 4.532, the slope of the least square line, and the resistance of the sense resistor 50 to get $R_s$ for the tested film. Once the $R_s$ value is calculated, the process is complete, as indicated in step 124.

Other methods can be used to calculate a sheet resistance $R_s$ from the measurement data, such as an averaging method. An $R_s$ value can be calculated for each set of A and B data. All the $R_s$ values can then be added together and divided by the total number of measurements taken to get the average $R_s$ value. The least square line fit method is used in the present embodiment, since it is insensitive to offsets in circuit components, as described in FIG. 7.

Using the above-described process, more measurements can be taken in a given time period. With a greatly increased amount of measurements, the accuracy of the calculations for sheet resistance and film thickness are also greatly increased.

Figure 6A:
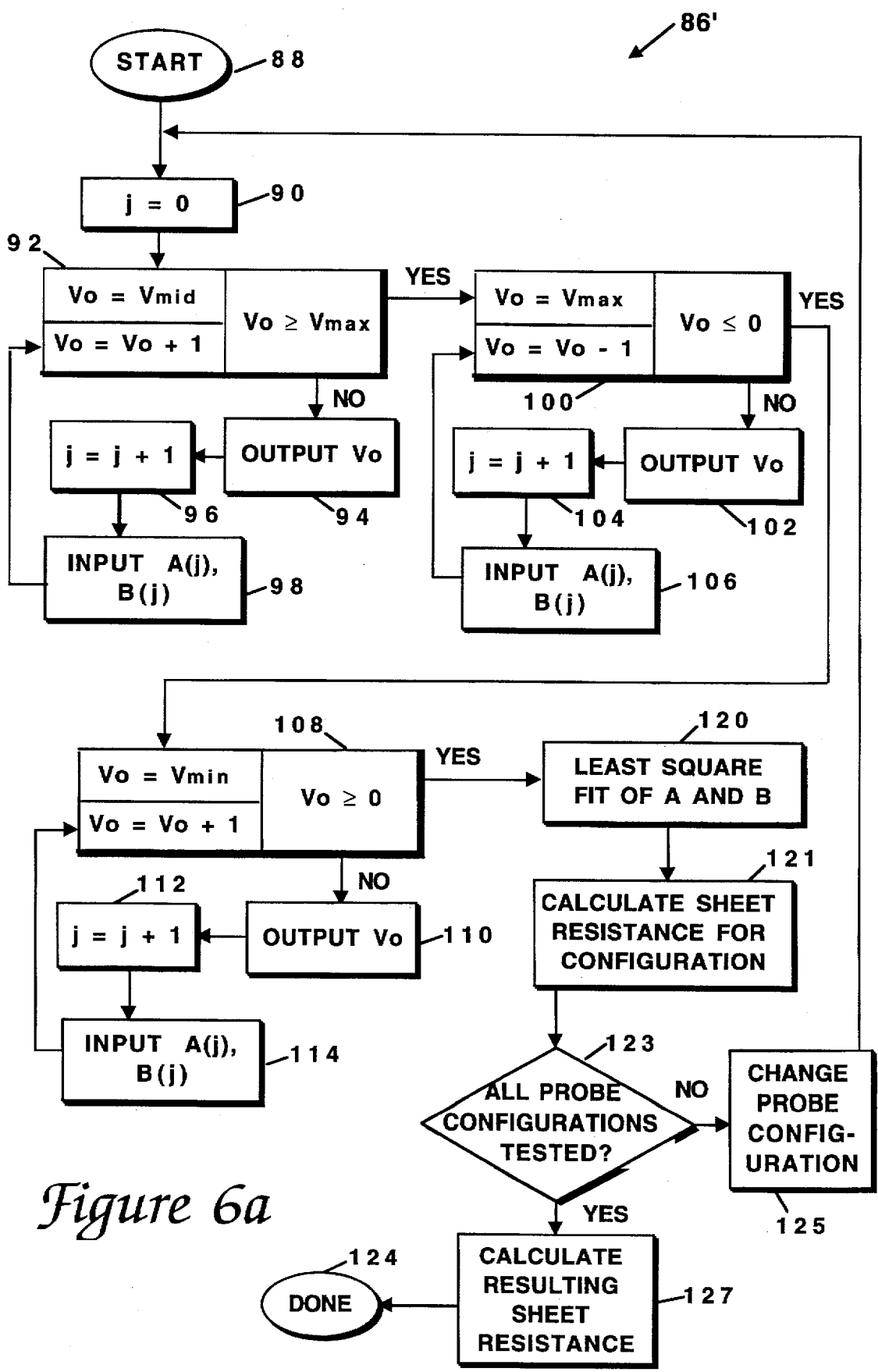
FIG. 6a is a flow diagram illustrating an alternate embodiment of the method of FIG. 6.

FIG. 6a is a flow diagram illustrating an alternate method 86' for measuring sheet resistance in step 79 of FIG. 5. Steps 88–114 are substantially similar to the same steps described with reference to FIG. 6. Steps 116 and 118 of FIG. 6 are omitted in the method 86', but can be included if desired for a particular application. Step 120 of calculating the least square line fit is accomplished as described with reference to FIG. 6.

In step 121, the computer 44 calculates a sheet resistance for the current configuration of probes. A probe configuration determines the particular probes that are being used to direct current and the probes used to measure voltage. In the embodiments described above, probes P1 and P4 were used to direct current through the film, and probes P2 and P3 were used to measure a voltage $V_{23}$. This can be considered configuration A. A second configuration of probes can also be used, configuration B, in which probes P1 and P3 are used to direct current through the film, and probes P2 and P4 are used to measure a voltage with differential amplifier 58. (Alternatively, probes P2 and P4 can direct the current and probes P1 and P3 can sense the voltage). Where $V_{23}$ is mentioned herein, $V_{24}$ (or, alternatively, $V_{13}$) can be substituted for $V_{23}$ if configuration B is being used.

The current configuration of the probes determines the formula used to calculate sheet resistance in step 121. If configuration A is used, the computer multiplies the factor 4.532, the slope of the least square line, and the resistance of the sense resistor 50 to get $R_s(A)$ for the tested film, as shown:

$$R_s(A) = 4.532 \frac{V_{23}}{I_{sense}} = 4.532 \frac{V_{23}}{V_{sense}} R_{sense}$$
$$= 4.532 m R_{sense}$$

where $I_{sense}$ is the current flowing through the film, $R_{sense}$ is the known resistance of the sense resistor 50, and $V_{sense}$ is the voltage across the sense resistor. $V_{sense}$ and $V_{23}$ are stored in the computer as values A(j) and B(j), respectively. This formula assumes that the four probes of the probe assembly 22 are spaced equally apart.

If configuration B is used, then the following formula is used:

$$R_s(B) = (4.532 \times 1.269) \frac{V_{24}}{I_{sense}} = (5.751) m R_{sense}$$

In next step 123, the computer checks if all desired probe configurations have used in the testing process. In some embodiments, only one configuration (e.g., configuration A) can be used. In other embodiments, for example, configuration A can be used to measure one sheet resistance, and configuration B can be used to measure a second sheet resistance. Configuration B can be useful to measure sheet resistance accurately near the edge of a sample, since configuration A tends to produce more errors in this region. In addition, measuring sheet resistances from both configurations A and B tends to average out errors introduced from irregular spacing of the probes P1–P4. Such methods of changing probe configurations are described in greater detail in the article, "Sheet Resistance Uniformity Evaluation by In-Line Four Point Probe with the Dual-Configuration Procedure", James R. Ehrstein, Subcommittee F1.06 Document #93B-1, Semiconductor Electronics Division, NIST, June 1993.

If another probe configuration needs to be used, then the computer changes the electrical connections to the next configuration in step 125. For example, if switching from configuration A to configuration B, probe P3 is disconnected from differential amplifier 58 and connected to ground (in FIG. 3), to amplifier 51 (in FIG. 3a), or to resistor 63 (in FIG. 3b). Probe P4 is also disconnected from its previous connection and is connected to differential amplifier 58. These connection changes can be accomplished using electrical relays, for example, as is well known to those skilled in the art. The process then returns to step 90 to collect datapoints for another voltage cycle at the new probe configuration. If all desired probe configurations have been used in step 123, then the process continues to step 127, where the resulting sheet resistance is calculated using the measured sheet resistances Rs(A) and Rs(B) (if appropriate). One well known equation to calculate a resulting sheet resistance from sheet resistances measured with different probe configurations is as follows:

$$R_s = R_s(A) \left[ -3.24272 + 7.04866 \frac{R_s(A)}{R_s(B)} - 2.79717 \left( \frac{R_s(A)}{R_s(B)} \right)^2 \right]$$

Once the $R_s$ value is calculated, the process is complete, as indicated in step 124.

FIG. 7 is a graph 126 showing the measurement points 128 of the voltages $V_{23}$ and $V_{sense}$ and the least squares line 130 calculated from the measurement points 128. The measurement points 128 are approximately linear, so that if a single measurement is much different from the other measurements, that measurement point 128 in graph 126 is spaced far from the least squares line 130 and is thus easy to single out.

As described above, $R_s$ is proportional to the slope of the least square line 130, and the slope of the line 130 is calculated in order to determine the value of $R_s$. Since a slope is measured, undesired offsets in the voltage source 34 or other electronic components in the system do not affect the result of the $R_s$ measurement. Line 130 may cross the origin of the axes of graph 126, indicating no offset in the differential amplifiers, or the line may cross the axes at a different point as shown in FIG. 7, indicating that an offset exists in the system. This offset, however, does not affect the result of the resistance measurement.

In using a sawtooth-shaped waveform as the voltage source, the measurement points are taken when $V_{23}$ and $V_{sense}$ are either both negative or both positive, and the measurement points 128 appear in the first and third quadrants of the graph. This has the effect of reducing hysteresis effects, such as magnetic effects, that occur on the film surface when a current is induced in the film. Also, the sawtooth-shaped waveform is a substantially continuous waveform and thereby avoids any large jumps in voltage and current that could occur from discontinuities. Such discontinuities can cause hysteresis effects in the film. By taking measurements with a continuous sawtooth-shaped waveform in the first and third quadrants of the graph of FIG. 7, one effectively degausses the measurement.

Figure 8A:
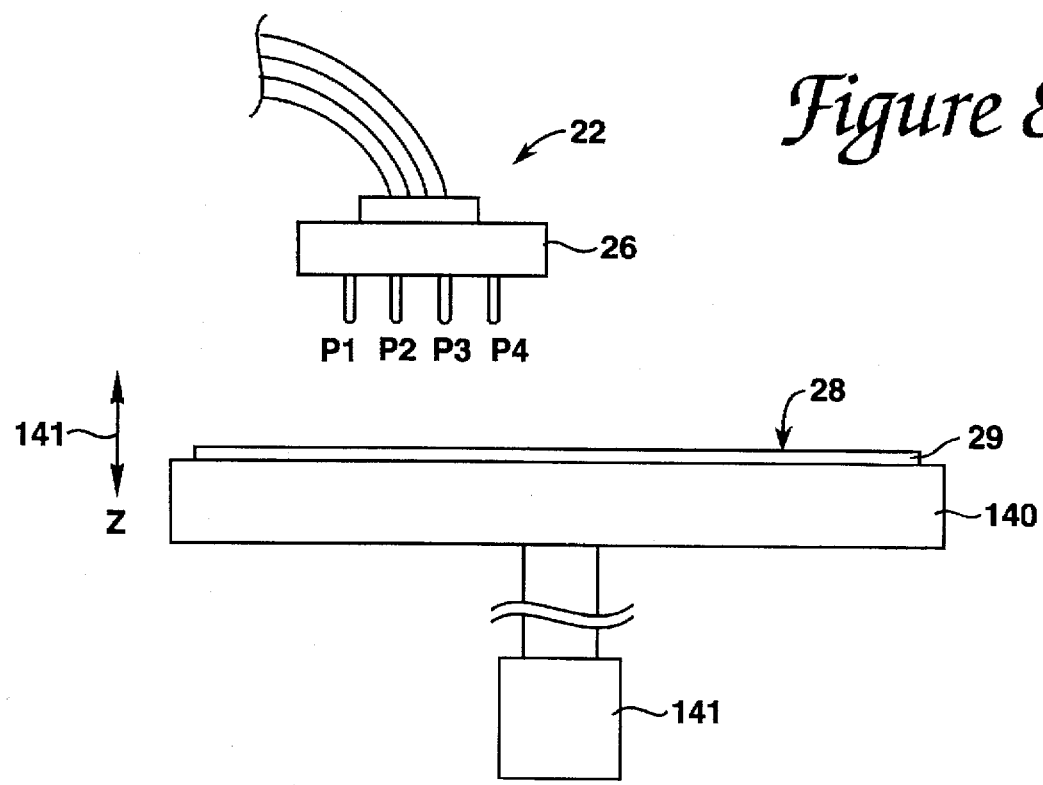
FIG. 8a is a side elevational view of the four point probe of FIG. 2 and a sample and chuck in a method of determining the thickness of a sample.

FIG. 8a is a side elevational view of probe assembly 22 positioned above substrate 29 and film 28. Substrate 29 is supported by a chuck 140 or other support surface. Before actual substrates and films are tested, the position of the probe assembly relative to the chuck is calibrated. For example, a conductive test substrate can be provided on chuck 140. The test substrate has a precisely known thickness and has similar characteristics to substrates and films desired to be tested. Relative motion is then provided between the probe assembly 22 and the chuck 140 to detect the position of the test surface, as described below. The relative positions of the chuck and the probe assembly are thus determined.

When testing a wafer or film for characteristics as in the method of FIG. 5, step 76 provides relative motion between the probe assembly 22 and the chuck 140 in a z-direction 142 until the probes P1–4 first contact the film surface. The relative motion is preferably precisely controlled by computer 44 or another similar computer controller through the use of motors or other components, as is well known to those skilled in the art. For example, chuck 140 can be moved by motor 141 in the z-direction 142, or, a motor can be connected to probe assembly 22 to move the probe assembly in the z-direction. The contact of probes P1–4 with the film or substrate can be detected by the computer 44 using the apparatus of FIGS. 3, 3a or 3b, and the location of the surface of the substrate can be determined, as explained below.

Figure 8B:
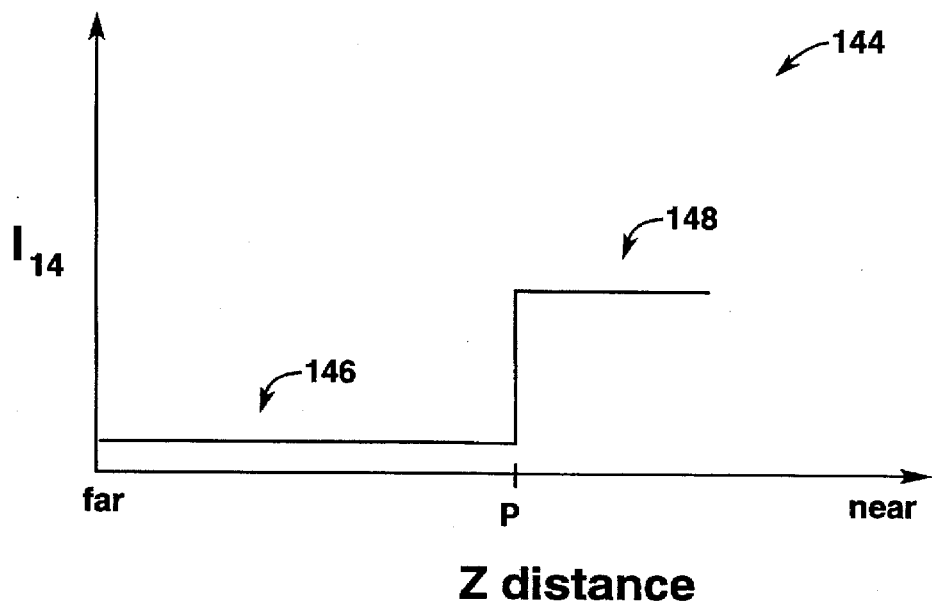
FIG. 8b is a graph of the current measurement of the four point probe as shown in FIG. 8a as a function of distance in a z-direction.

FIG. 8b is a graph 144 showing the sensed current $I_{14}$ (i.e., voltage $V_{sense}$) with respect to the distance in the z-direction 142 of the probe assembly 22 from the film surface 28. The horizontal axis shows the distance in the z-direction between the probes P1–4 from the chuck 140, where the distance decreases along the axis from left to right. When the probe assembly is positioned away from (not in contact with) the film, no current flows between the probes of the probe assembly and no voltage is sensed, as shown by the portion 146 of the graph. However, once the tips of the probes contact the film at distance P, current begins to be sensed by the differential amplifiers 52 and 58, since the contact of the probes P1 and P4 with the conductive film surface allows current to flow. This causes the step waveform shown in graph 144. Once a current and voltage are sensed, as shown in portion 148 of graph 144, the movement between the probe assembly and the substrate is halted (movement can continue past contact point P due to the springs in the probes P1–4). The point P precisely corresponds to the surface of the film on the substrate. Since the location of the surface of the substrate is known, the thickness of the test substrate can be derived using the calibration measurements. The procedure of FIGS. 8a and 8b provides the entire thickness of the substrate and film, if present. However, the thickness of a film on the substrate is typically negligible compared to the thickness of the substrate, so that thickness resulting from the process of FIGS. 8a and 8b can be considered the substrate thickness. If a very precise measurement of the substrate is desired, the thickness of the film (found in step 80 of the method of FIG. 5) can be subtracted from the thickness found by the above procedure, where the result is the thickness of the substrate. The method of FIGS. 8a and 8b is much more precise than previous methods of measuring substrate thickness, and is conveniently incorporated in-situ in the method for determining sheet resistance and thickness of the film on the substrate.

In alternate embodiments, data can be recorded for the amount of current sensed as a function of probe pressure. For example, the motion between probe assembly and chuck 140 can be continued after current is initially sensed so that the probes P1–4 compress and are forced a small distance into the film (or substrate). The springs connected to the probes allow the probes to compress. Since measurements can change depending on how much pressure is applied to the probes on the film 28, it can be useful to provide systematic data showing the effects of pressure on the measurements.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A method for measuring sheet resistance of a film surface comprising:
    engaging a probe assembly including a plurality of probes with a surface of a film;
    creating a variable voltage using a voltage source on said probe assembly to create a variable voltage in said film, thereby creating a variable current through a portion of said film;
    measuring said variable current flowing through said portion of said film at a plurality of points in time;
    measuring a film voltage between two of said probes of said probe assembly at a corresponding plurality of points in time to when said variable current is measured, said film voltage being influenced by said variable current; and
    calculating a sheet resistance of said film from a plurality of ratios of said measured film voltages to corresponding measured currents.

2. A method as recited in claim 1 wherein said variable voltage is created on a first one of said probes of said probe assembly, and further comprising a step of creating a dependent variable voltage on a second one of said probes of said probe assembly such that said current in said film flows from said first probe to said second probe, wherein said dependent variable voltage is based on said variable voltage.

3. A method as recited in claim 2 wherein said first and second probes are outer probes of said probe assembly and wherein said step of measuring said film voltage between said probes includes measuring said film voltage between third and fourth ones of said probes.

4. A method as recited in claim 2 wherein said step of creating a dependent variable voltage on said second probe includes inverting said variable voltage and providing said inverted variable voltage as said dependent variable voltage at said second probe, thereby creating approximately zero voltage at said third and fourth probes of said probe assembly.

5. A method as recited in claim 4 wherein said step of creating a dependent variable voltage on said second probe includes coupling an inverting amplifier between said first and second probes and coupling a buffer amplifier between said first and second probes, said buffer amplifier having a high input impedance.

6. A method as recited in claim 4 wherein said step of measuring said current flowing through said film includes coupling a sense resistor between said waveform generator and said first probe, and measuring a voltage across said sense resistor.

7. A method as recited in claim 6 wherein said step of creating a dependent variable voltage on said second probe includes creating a dependent current on said second probe by coupling an inverting amplifier to said output of said voltage source and coupling an output of said inverting amplifier to said second probe by a second resistor.

8. A method as recited in claim 7 wherein said second resistor has a same resistance value as said sense resistor such that a voltage on said surface of said film at said second probe is equal in magnitude and opposite in phase to a voltage on said surface of said film at said first probe.

9. A method as recited in claim 2 further comprising engaging said probe assembly with a surface of a film at a plurality of locations on the film surface and calculating a sheet resistance for each location thus engaged.

10. A method as recited in claim 2 wherein said waveform generator creates a cyclical sawtooth current in said film, and wherein said waveform generator includes a digital computer.

11. A method as recited in claim 2 further comprising calculating a film thickness from said sheet resistance.

12. A method as recited in claim 1 further comprising a step of calculating a Figure of Merit from said measured currents and voltages to determine the quality of said measurements of said variable current and said variable voltage.

13. A method for measuring sheet resistance of a film surface comprising:

engaging a probe assembly including a plurality of probes with a surface of a film;

creating a variable voltage on a first one of said probes of said probe assembly using a voltage source;

creating a dependent variable voltage on a second one of said probes of said probe assembly by inverting said variable voltage and providing said inverted variable voltage at said second probe, thereby creating a variable current through said film, wherein said current in said film flows from said first probe to said second probe;

measuring said variable current flowing through said portion of said film at a plurality of points in time, said variable current being measured at a portion of said film between said first and second probes where an average voltage is close to zero;

measuring a film voltage between two of said probes of said probe assembly at a corresponding plurality of points in time to when said variable current is measured; and calculating a sheet resistance of said film from a plurality of ratios of said measured film voltages to corresponding measured currents.

14. A method as recited in claim 13 wherein said first and second probes are outer probes of said probe assembly and wherein said step of measuring said film voltage between said probes includes measuring said film voltage between third and fourth ones of said probes.

15. A method as recited in claim 13 further comprising engaging said probe assembly with a surface of a film at a plurality of locations on the film surface and calculating a sheet resistance for each location thus engaged.

16. A method as recited in claim 13 further comprising a step of calculating a Figure of Merit from said measured currents and voltages to determine the quality of said measurements of said variable current and said variable voltage.

17. A method as recited in claim 13 wherein said step of creating a dependent variable voltage on said second probe includes coupling an inverting amplifier between said first and second probes and coupling a buffer amplifier between said first and second probes, said buffer amplifier having a high input impedance.

18. A method as recited in claim 13 wherein said step of measuring said current flowing through said film includes coupling a sense resistor between said waveform generator and said first probe, and measuring a voltage across said sense resistor.

19. A method as recited in claim 18 wherein said step of creating a dependent variable voltage on said second probe includes creating a dependent current on said second probe by coupling an inverting amplifier to said output of said voltage source and coupling an output of said inverting amplifier to said second probe by a second resistor, wherein said second resistor has a same resistance value as said sense resistor such that a voltage on said surface of said film at said second probe is equal in magnitude and opposite in phase to a voltage on said surface of said film at said first probe.

20. A method as recited in claim 13 wherein said waveform generator creates a cyclical sawtooth current in said film, and wherein said waveform generator includes a digital computer.

21. A method for measuring sheet resistance of a sample comprising:

(a) engaging a probe assembly including a plurality of probes with a surface of a sample;

(b) applying a first voltage from a voltage source to a first probe of said probe assembly;

(c) providing an inverted voltage based on and inverted from said first voltage to a second probe of said probe assembly, thereby creating a current through said sample;

(d) measuring said current through said sample;

(e) measuring a sample voltage between said first probe and said second probe;

(f) repeating steps (b) through (e) applying a second voltage in place of and different from said first voltage; and (g) calculating sheet resistance using a plurality of said measured currents and a plurality of said sample voltages.

22. A method as recited in claim 21 wherein said sample is a film deposited on a substrate.

23. A method as recited in claim 21 wherein said sample is a substrate.

24. A method as recited in claim 21 wherein said first and second probes are outer probes of said probe assembly and wherein said step of measuring said sample voltage between said probes includes measuring said sample voltage between two inner probes of said probe assembly.

25. A method as recited in claim 24 wherein said calculating sheet resistance includes:

calculating a first sheet resistance from the ratio of said sample voltage to said current resulting from said first voltage being applied;

calculating a second sheet resistance from the ratio of said sample voltage to said current resulting from said second voltage being applied; and calculating a resulting sheet resistance from said first sheet resistance and said second sheet resistance.

26. A method as recited in claim 21 wherein said step of creating an inverted variable voltage on said second probe includes providing third and fourth probes on said probe assembly for measuring said sample voltage, said third and fourth probes positioned between said first and second probes, wherein said first voltage and said inverted voltage create a voltage close to zero in said sample at said third and fourth probes of said probe assembly, thereby allowing accurate measurements of small changes in said sample voltage.

27. A method as recited in claim 21 wherein said step of creating an inverted variable voltage on said second probe includes providing a buffer amplifier between said first and second probes, said buffer amplifier having a high input impedance.

28. A method as recited in claim 21 wherein said first voltage created on said first probe, said inverted voltage, and said current vary with time, and wherein said current and said sample voltage are measured at a plurality of points in time to provide said plurality of currents and sample voltages.

29. A method as recited in claim 28 wherein said sheet resistance of said sample is calculated from a plurality of ratios, each of said ratios being a ratio of a measured sample voltage to a corresponding measured current.

30. A method as recited in claim 21 wherein said step of measuring said current flowing through said sample includes coupling a sense resistor between said waveform generator and said first probe, and measuring a voltage across said sense resistor.

31. A method as recited in claim 30 wherein said step of providing an inverting voltage to said second probe includes inverting said voltage from said voltage source with an inverter and providing a second resistor between said inverter and said second probe.

32. A method as recited in claim 23 further comprising a step of determining the thickness of said substrate when said probe assembly is moved to engage said substrate by detecting a contact current sensed by said probe assembly when said probes of said probe assembly contact said substrate, wherein a distance between said probes and a surface supporting said substrate is recorded when said contact current is sensed.

33. A method as recited in claim 13 further comprising calculating a film thickness from said sheet resistance.

34. A method as recited in claim 13 wherein said film surface is provided on a substrate, and further comprising determining the thickness of said substrate and film when said probe assembly is moved to engage said film by detecting a contact current sensed by said probe assembly when said probes of said probe assembly contact said film, wherein a distance between said probes and a surface supporting said substrate is recorded when said contact current is sensed.

35. A method as recited in claim 13 further comprising calculating a Figure of Merit from said measured currents and voltages to determine the quality of said measurements of said variable current and said variable voltage.

36. A method as recited in claim 18 further comprising:
calculating a first Figure of Merit from said measured currents and voltages to determine the quality of said measurements of said variable current and said variable voltage;

changing a value of said sense resistor;

performing said measurements of said current and said sample voltages and calculating a second Figure of Merit; and providing a sense resistor value for sheet resistance measurements that caused a Figure of Merit indicating the highest quality of measurements.

* * * * *